United States Patent
Wang et al.

(10) Patent No.: US 10,057,987 B2
(45) Date of Patent: Aug. 21, 2018

(54) PRINTED CIRCUIT BOARD WITH SIDE ACCESS TERMINATION PADS

(71) Applicant: ILLINOIS TOOL WORKS INC., Glenview, IL (US)

(72) Inventors: XianBo Wang, Guangdong (CN); Mark R. Heckenkamp, Sussex, WI (US); Jerald J. Smith, Waukesha, WI (US); Maxwell J. Kirby, West Allis, WI (US); William E. Bargholtz, Jr., Palmyra, WI (US); Michael S. Osvatic, Waukesha, WI (US)

(73) Assignee: Illinois Tool Works Inc., Glenview, IL (US)

( * ) Notice: Subject to any disclaimer, the term of this patent is extended or adjusted under 35 U.S.C. 154(b) by 81 days.

(21) Appl. No.: 14/901,751

(22) PCT Filed: May 23, 2014

(86) PCT No.: PCT/US2014/039448
§ 371 (c)(1),
(2) Date: Dec. 29, 2015

(87) PCT Pub. No.: WO2015/005982
PCT Pub. Date: Jan. 15, 2015

(65) Prior Publication Data
US 2016/0374201 A1  Dec. 22, 2016

Related U.S. Application Data

(60) Provisional application No. 61/843,517, filed on Jul. 8, 2013.

(51) Int. Cl.
*H05K 1/11* (2006.01)
*H05K 3/00* (2006.01)
(Continued)

(52) U.S. Cl.
CPC .......... *H05K 1/119* (2013.01); *H01R 12/728* (2013.01); *H01R 12/75* (2013.01); *H05K 1/09* (2013.01);
(Continued)

(58) Field of Classification Search
CPC .......... H05K 1/119; H05K 1/181; H05K 1/09; H05K 1/117; H05K 3/007; H05K 3/325; H05K 3/3405; H01R 12/728; H01R 12/75
See application file for complete search history.

(56) References Cited

U.S. PATENT DOCUMENTS 4,029,384 A * 6/1977 Reinwall, Jr. .......... H01R 4/245
                                                        439/397
4,173,388 A * 11/1979 Brandeau ............... H01R 4/182
                                                        174/94 R
(Continued)

FOREIGN PATENT DOCUMENTS

DE    3030236 A1 *  3/1982   ............. H01R 12/75
DE    4324917 A1 *  2/1994   ............. H01R 12/55
(Continued)

OTHER PUBLICATIONS

ISR and WO for PCT/US2014/039448 dated Sep. 15, 2014.

*Primary Examiner* — Nathan Milakovich
(74) *Attorney, Agent, or Firm* — Boyle Fredrickson, S.C.

(57) ABSTRACT

A printed circuit board provides lateral notches for receiving wire conductors in a lateral direction to be joined with printed circuit board traces by solder or an insulation displacement connector eliminating the need for laborious sequential insertion of conductors through printed circuit board holes.

16 Claims, 3 Drawing Sheets

(51) Int. Cl.
*H05K 3/32* (2006.01)
*H05K 3/34* (2006.01)
*H01R 12/75* (2011.01)
*H01R 12/72* (2011.01)
*H05K 1/09* (2006.01)
*H05K 1/18* (2006.01)

(52) U.S. Cl.
CPC ............ *H05K 1/117* (2013.01); *H05K 1/181* (2013.01); *H05K 3/007* (2013.01); *H05K 3/325* (2013.01); *H05K 3/3405* (2013.01); *H05K 2201/09063* (2013.01); *H05K 2201/09181* (2013.01); *H05K 2201/10015* (2013.01); *H05K 2201/10022* (2013.01); *H05K 2201/1034* (2013.01); *H05K 2201/10053* (2013.01); *H05K 2201/10287* (2013.01); *H05K 2201/10356* (2013.01); *H05K 2201/10386* (2013.01); *H05K 2203/0195* (2013.01); *H05K 2203/167* (2013.01)

(56) References Cited

U.S. PATENT DOCUMENTS

| | | | | |
|---|---|---|---|---|
| 4,261,629 A | * | 4/1981 | Reynolds | H01R 4/2462 439/399 |
| 4,769,908 A | * | 9/1988 | Olsson | H01R 43/16 29/827 |
| 4,973,262 A | * | 11/1990 | Gerke | H01R 4/2425 439/395 |
| 5,577,930 A | * | 11/1996 | Dahlem | H01R 4/2454 29/866 |
| 5,618,187 A | * | 4/1997 | Goto | H01R 25/162 439/79 |
| 5,807,121 A | | 9/1998 | Fulop et al. | |
| 6,549,427 B1 | * | 4/2003 | Johnston | H05K 3/325 361/822 |
| 7,188,408 B2 | * | 3/2007 | Korsunsky | H01R 23/688 228/180.22 |
| 7,232,331 B2 | * | 6/2007 | Dennes | H01R 4/2429 439/395 |
| 7,347,717 B2 | | 3/2008 | Taylor | |
| 7,682,207 B2 | * | 3/2010 | Clark | H01R 43/16 439/885 |
| 8,192,223 B2 | * | 6/2012 | Bishop | H01R 4/2433 439/395 |
| 2007/0254521 A1 | * | 11/2007 | D'Agostini | H01R 4/2445 439/404 |
| 2008/0096411 A1 | | 4/2008 | Lung et al. | |
| 2009/0111311 A1 | | 4/2009 | Weber | |
| 2014/0160681 A1 | * | 6/2014 | Chen | H01R 12/737 361/704 |

FOREIGN PATENT DOCUMENTS

| | | | |
|---|---|---|---|
| DE | 10222324 A1 | 11/2003 | |
| EP | 1939987 A2 * | 7/2008 | ........... H01R 4/2425 |
| FR | 2550683 A1 | 2/1985 | |

* cited by examiner

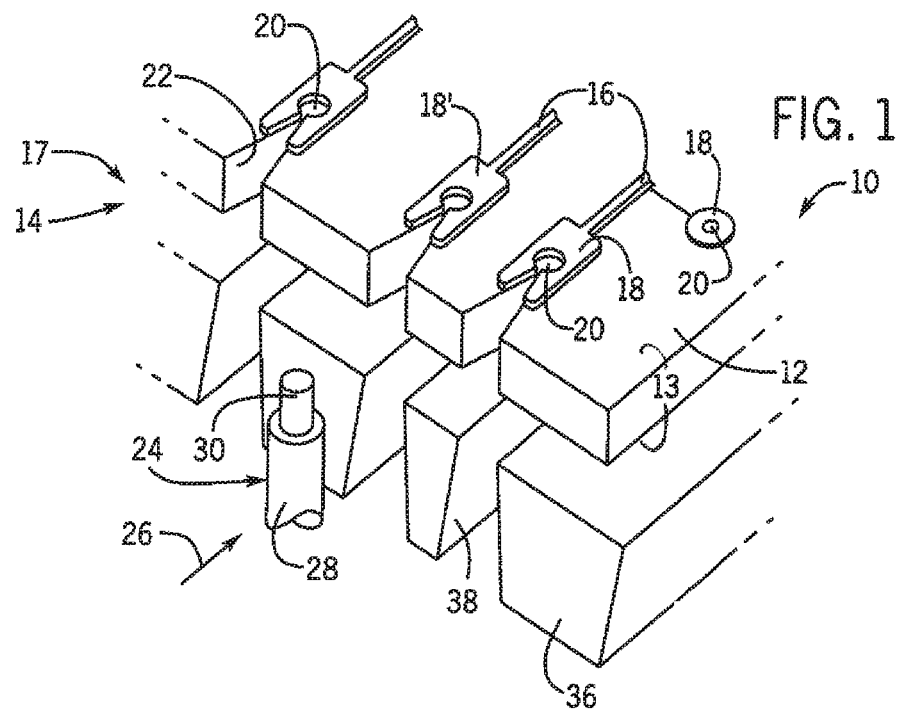
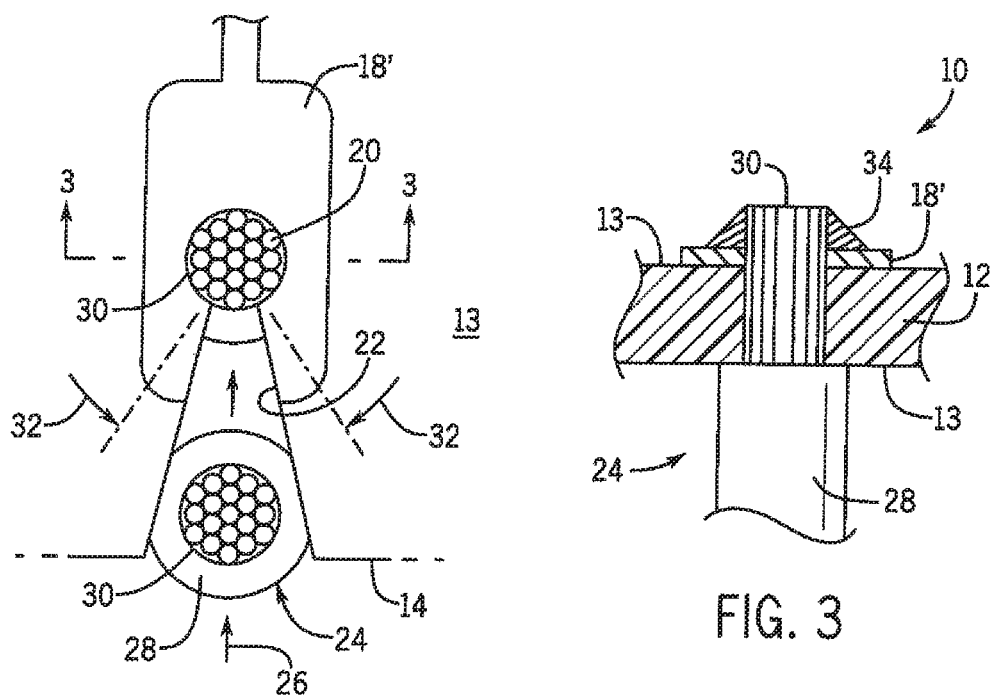
FIG. 1
FIG. 2
FIG. 3

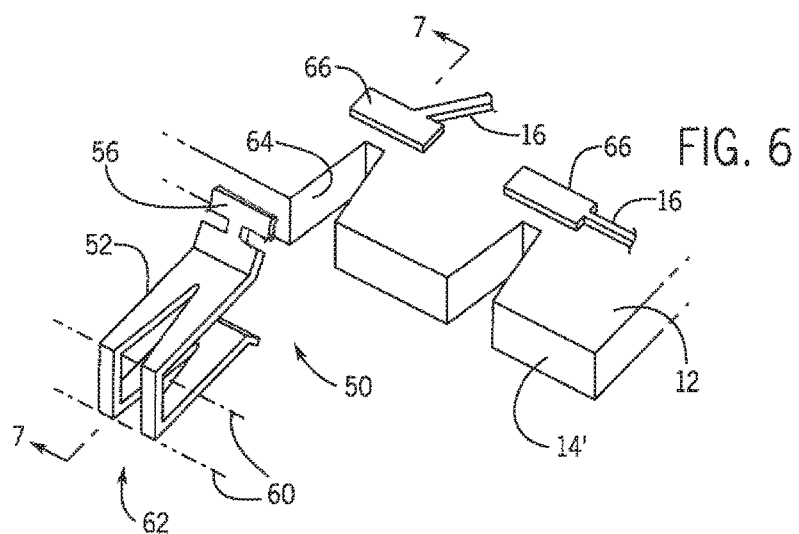
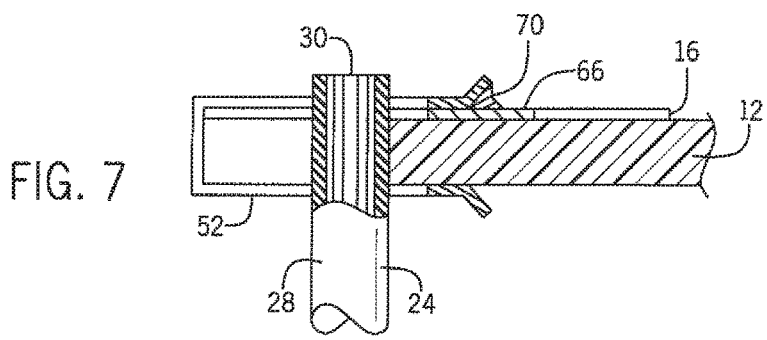
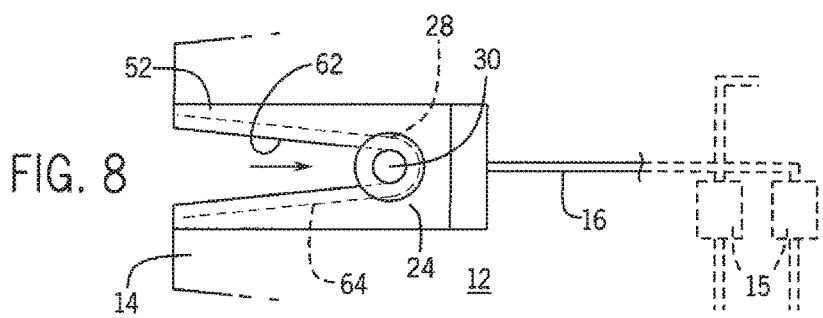

PRINTED CIRCUIT BOARD WITH SIDE ACCESS TERMINATION PADS

CROSS-REFERENCE TO RELATED APPLICATIONS

This application is a National Phase of PCT/US2014/039448 filed May 23, 2014 and claims the benefit of U.S. Provisional Application 61/843,517 filed Jul. 8, 2013 and hereby incorporated by reference.

BACKGROUND OF THE INVENTION

The present invention relates to printed circuit boards and in particular to a printed circuit board providing improved attachment of printed circuit board traces to individual wire conductors.

Printed circuit boards provide a generally planar insulating substrate supporting a pattern of conductive traces that can be used to interconnect electrical components of an electrical circuit. The traces may be rapidly fabricated, for example, by a photo etching processes. Separate conductive pads may be placed on the front and back surfaces of the printed circuit board to surround opposite sides of a hole passing through the printed circuit board. Further, these pads may be connected by a conductive material (via) extending through the hole between the pads by a "plate through" process allowing conductive traces to pass between sides of the printed circuit boards.

The electrical components may be attached to the traces in a number of ways. When the electrical components have wire leads (through hole devices), the printed circuit board may include holes through which the wire leads of the components may be inserted. The holes are typically surrounded by a pad of conductive material connected to the traces and the leads of the component may be soldered to the pad. Alternatively, traces may provide for pads to which leads or pads are attached without through holes but held simply by the mechanical joint provided by the solder. These devices are termed "surface mount devices".

Components may be rapidly assembled to the printed circuit board by computerized "pick and place" devices or similar machines and soldered to the traces by wave soldering, reflow soldering ovens or the like. After soldering, the electrical components are electrically and mechanically secured in a robust physical assembly.

Often the printed circuit board must communicate with other electrical devices through a wiring harness of separate wire conductors each providing a multi strand or single-strand conductor surrounded by an insulating jacket. The same technique used to attach the through hole electrical components to the printed circuit board may be used to connect harness wires to the printed circuit board. That is, each of the wires may have a portion of the insulation at the connecting end of wire removed (stripped) to expose a length of conductor and the conductor may be inserted through a hole in the printed circuit board surrounded by a conductive pad which is soldered to the conductor.

Generally insertion of the conductors of wires through printed circuit board holes is performed manually and can be difficult because of the need to thread the conductors individually through the holes without dislodging previously inserted but unsoldered conductors. Inserting the conductors one wire at a time can require substantial bending of the individual conductors to accommodate their different stages of insertion. Multi-strand conductors can sometimes be unraveled during this insertion process to create inadvertent loose conductor strands that may cause undesirable electrical shorting. This latter problem can be reduced by tinning the exposed conductors (pre-coating them with solder) before installation in the printed circuit board, but this requires an additional step that may not be desired.

SUMMARY OF THE INVENTION

The present invention provides a printed circuit board that facilitates the connection of the printed circuit board to individual wire conductors by placing the connection holes and pads of the printed circuit board near the edge of the printed circuit board and providing slats from the edge into the holes allowing lateral or edgewise insertion of wire conductors into the holes. The conductors are retained in the slotted holes by soldering to conductive pads as before or by an insulation displacement terminal. The side insertion reduces the difficulty of aligning the wires with individual holes and does not promote unraveling of multi-strand conductors.

In one embodiment, the invention provides a printed circuit board assembly including a printed circuit board having an insulating, substantially planar and rigid substrate defining opposed laterally extending faces bounded at a periphery by edges, at least one face including adhered, laterally-extending conductive traces. Electrical components are attached to the metallic traces to provide at least a portion of an electrical circuit. An edge of the printed circuit board substrate may provide a set of notches extending laterally from the edge to a termination point within the periphery and each termination point may be partially surrounded by electrically conductive material covering the surface of the face outside of the notch about the termination point with the conductive material electrically connected with at least one trace electrically communicating with at least one of the electrical components. In this way, electrical wire conductors may be attached to at least one trace of each notch by orienting the electrical wire conductor to extend perpendicularly to the faces and sliding the electrical conductors laterally into the slots to electrically connect with the electrically conductive material.

It is thus one feature of at least one embodiment of the invention to provide a method of rapidly terminating wire conductors with the printed circuit board by eliminating the need for precise alignment of each of the conductors with a hole.

The electrically conductive material may be trace material physically continuous with at least one trace and positioned to be attached to the electrical wire conductor by soldering thereto.

It is thus one feature of at least one embodiment of the invention to provide a termination method amenable to conventional soldering techniques and board fabrication.

The notches may be tapered to have an opening width measured perpendicularly to the extent of the notch between the edge and the termination point greater than a dimension at the termination point measured perpendicularly to the extent of the notch.

It is thus one feature of at least one embodiment of the invention to permit relaxed alignment of the wires during assembly as accommodated by the widening of the notches at the board edges. This same feature can assist in corralling multi-strand conductors.

The notches may include a constricting portion, narrower than the opening width and the width at the termination point, positioned between the opening width and the width at termination point removed from a furthest lateral extent of the notch from the edge by substantially the width at the termination point.

It is thus one feature of at least one embodiment of the invention to promote retention of individual wires at the termination points after insertion for subsequent operations as may be needed prior to soldering.

The trace material may surround a region of the notch past the constricting portion at the termination point by a least 270 degrees measured from a center of the region.

It is thus one feature of at least one embodiment of the invention to provide electrical communication between the individual wires and the printed circuit board comparable to that achieved by through hole insertion.

In one embodiment, the electrically conductive material may be a first metal plate fitting over a notch and having a cutting edge displaced inward from the lateral edges of the notch and tapering inward toward the termination point to cut through insulation of an electrical wire conductor extending perpendicular to the faces when the electrical wire conductor is pressed into the notch laterally to the termination point to provide a gas-tight electrical connection between the metal plate and a center conductor of the wire.

It is thus one feature of at least one embodiment of the invention to provide an insulation displacement termination working with the notch printed circuit board structure of the present invention.

Electrically conductive material may further include a second metal plate in opposition to the first metal plate fitting under the notch and having a tapered cutting edge displaced inward from the lateral edges of the notch also to cut through insulation of a wire extending perpendicularly to the faces when the electrical conductor is pressed into the notch laterally.

It is thus one feature of at least one embodiment of the invention to provide two points of electrical and mechanical connection for a more robust assembly.

A portion of the clip may extend over at least one trace and is soldered thereto.

It is thus one feature of at least one embodiment of the invention to provide a method of pre-attachment of the insulation displacement clip to the printed circuit board to allow soldering operations to be wholly disjoint from wire assembly operations.

The clip may provide a front joining member holding the first and second metal plates in opposition with inward spring biasing of the first and second metal plates together to a dimension less than the thickness of the substrate between the opposed laterally extending faces.

It is thus one feature of at least one embodiment of the invention to provide a clip that may retain itself in position prior to soldering operations.

The notches may be spaced apart in substantially equal separation along the edge.

It is thus one feature of at least one embodiment of the invention to provide a termination system compatible with harnesses configured for other electrical connector types.

The electrical wire conductors may be held in a jig retaining them parallel at a spacing corresponding to a spacing of the notches and wherein the conductors are assembled to the printed circuit board by moving the jig to simultaneously engage the electrical conductors within the notches.

It is thus one feature of at least one embodiment of the invention to facilitate simultaneous termination of each of the wires and/or to permit a more generous alignment structure in the jig than possible with the printed circuit board.

The metal clips using some embodiments of the invention may be joined to a carrier strip allowing the metal clips to be installed on the notches simultaneously by movement of the carrier strip. The carrier strip may then be subsequently removed.

It is thus one feature of at least one embodiment of the invention to provide rapid simultaneous assembly of the metal clips to the printed circuit board.

The metal clips and carrier strip may be punched from a single sheet of material.

It is thus a feature of at least one embodiment of the invention to provide a simple fabrication method for the metal clips that conveniently attaches them together for installation.

These particular objects and advantages may apply to only some embodiments falling within the claims and thus do not define the scope of the invention.

BRIEF DESCRIPTION OF THE DRAWINGS

FIG. 1 is a fragmentary perspective view of a printed circuit board providing side access slots positioned above an alignment fixture and showing a stripped wire before insertion into a slot for attachment to the printed circuit board;

FIG. 2 is a top fragmentary view of a slot and hole in the printed circuit board showing the surrounding conductive pad; the tapering of the slot funnels the conductor into the hole, and the lip between the slot and the hole serves to mechanically restrain the conductor within the hole against it slipping outward through the slot;

FIG. 3 is across-section along line 3-3 of FIG. 2 showing soldering of the conductor to the pad to retain the conductor within the hole;

FIG. 6 is a perspective fragmentary view similar to FIG. 1 showing a folding of the insulation displacement connector to fit over the slots in the printed circuit board and then to be attached by soldering to pads associated with each slot;

FIG. 7 is a cross-sectional view along line 7-7 of FIG. 6 with the insulation displacement terminal positioned on the slot and a wire captured by the insulation displacement connector; and FIG. 8 is atop plan view of the installed insulation displacement connector holding a wire as installed on the printed circuit board.

DESCRIPTION OF THE PREFERRED EMBODIMENT

Figure 4:
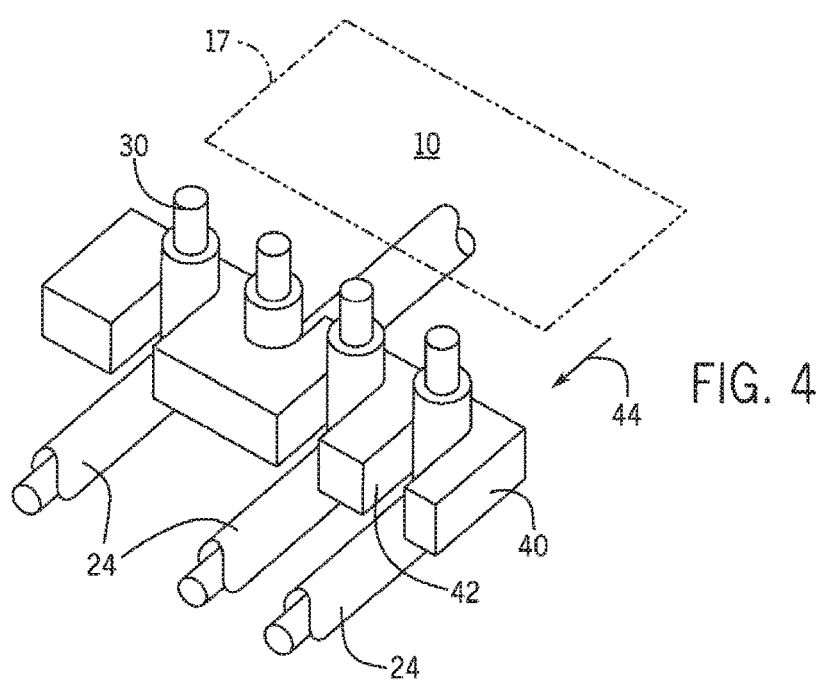
FIG. 4 is a perspective fragmentary view of a set of wires with pre-stripped conductors held by a housing of the electrical component for simultaneous side-installation of the printed circuit board onto the wires.

Referring now to FIG. 1, a printed circuit board 10 per the present invention may provide for an electrically insulating substrate 12, for example, formed of a composite of epoxy and fiberglass material or of a phenolic material providing generally a planar panel having broad upper and lower surfaces 13 separated by a relatively narrow thickness revealed at board edges 14 circumscribed by a periphery 17.

One or both of the upper and lower surfaces of the printed circuit board 10 may provide for conductive traces 16 typically being a copper cladding adhered to the surface and then photochemically etched to provide the trace dimensions and then frequently plated or coated, for example, with tin or the like. The conductive traces 16 are used to join together various electrical components 15 such as resistors, capacitors, diodes, switches and switch contacts, connectors, and integrated circuits (shown in FIG. 8).

The traces 16 may connect to one or more conductive pads 18 positioned near an edge 14' of the printed circuit board 10 but within the periphery 17, the conductive pads 18 surrounding printed circuit board holes 20 typically drilled through the substrate 12, for example, by a computer-controlled milling machine, after etching of the traces 16 and pads 18. The holes 20 may be plated through as is understood in the art.

Tapered slots 22 may be cut between the edge 14' and each hole 20, for example, by a computer-controlled mill cutter or saw to provide aside access to the hole 20 by a conductor 30 of a wire 24. The side access moves the wire 24 in a lateral access direction 26 generally parallel to the planes of the upper and lower surface of the substrate 12.

The conductor 30 may be, for example, a stranded wire core coaxially surrounded by flexible insulation 28. The insulation 28 may be removed to expose a length of the conductor slightly greater than the thickness of the printed circuit board 10, prior to such installation, by techniques well known in the art.

Referring now to FIG. 2, as the wire 24 is moved in the access direction 26 to enter the slat 22, the conductor 30 is compressed by the narrowing of the laterally opposed walls of the slot 22. At the edge 14, the slot 22 will typically be much wider than the conductor 30 so as to facilitate alignment, but at the point of entry into the hole 20 removed from the periphery 17, the slot 22 will be narrower than the diameter of the hole 20 requiring a slight detenting deformation of the conductor 30 to fit within the hole 20. This compression serves to retain conductor 30 in the hole 20 against lateral dislodgment as so installed before soldering.

Referring now to FIGS. 2 and 3, generally the pad 18 will surround approximately 270 degrees of the hole 20 as indicated by arc 32 so that the conductor 30 may be soldered with solder 34 to the pad 18 over a significant portion of the circumference of the conductor 30 to be securely retain within the hole 20. The hole 20 may be plated along its side walls for additional areas of connection to the conductor 30 when soldered, and a second pad (not shown) opposite pad 18 may be also provided communicating by the plating-through of the hole 20.

Referring again to FIG. 1, alignment of the wires 24 with the slots 22 may be facilitated by an alignment jig 36 positioned in alignment to the underside of the printed circuit board 10 and having corresponding slots 38, for example, tapering along the access direction 26 with slats 22 and aligned with slots 22. Optionally the slats 38 may also have an additional upwardly inward tapering in a direction perpendicular to the plane of the substrate 12. This jig 36 can thus facilitate proper and rapid alignment of the wires 24 with the slots 22 and insertion of the conductors 30 into the slots 22 and retention therein individually or simultaneously.

The slots 38 generally will narrow to a dimension equal to the outside diameter of the insulation 28 (rather than the conductor 30 as is the case with slots 22) so as not to interfere with full insertion of the wires 24 into the slots 22 and to help retain and align the wires 24.

Referring now to FIG. 4, a housing of a device receiving the printed circuit board 10 may provide for an effective alignment jig 36 by means of a guide block 40 incorporated into a housing of the device and having slots 42 performing a similar function as the slots 38 as described above. This guide block 40 allows multiple wires 24 with pre-stripped conductors to be pre-aligned for simultaneous installation on the printed circuit board 10 with movement in access direction 44, generally the opposite of access direction 26 as a result of movement of the printed circuit board 10 rather than the individual wires 24. The guide block 40 may also provide for mechanical strain relief for the wires 24. In this case the slots 42 may not provide an upwardly directed taper.

Figure 5:
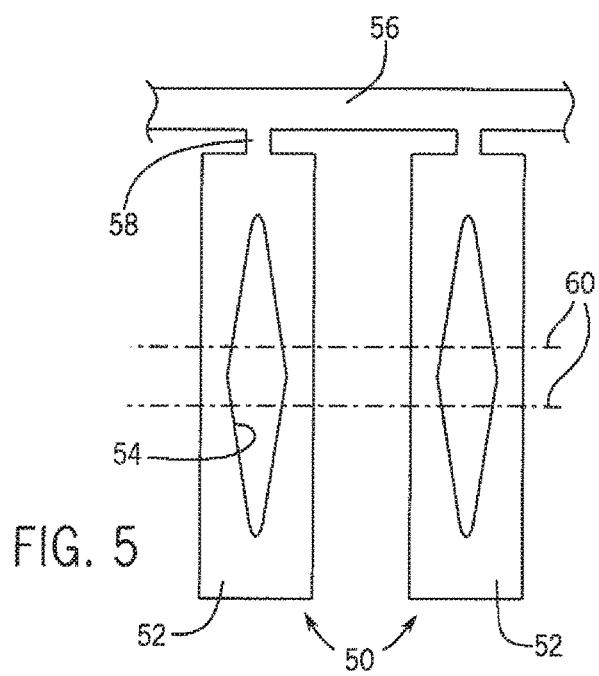
FIG. 5 is a top plan devotional view of a metal stamping in one embodiment of the invention showing insulation displacement connector elements that may be used for attachment of wires to a slotted printed circuit board.

Referring now to FIG. 5, in an alternative embodiment, insulation displacement connectors 50 may be formed, for example, as stamped from a sheet of conductive metal, each providing, for example, an elongate metal strip 52 having a diamond-shaped aperture 54 or apertures with parallel sides and a tapered lead-ins at the ends and connected to a common lead frame 56 by breakable tabs 58. The metal strips 52 may be spaced along the lead frame 56, for example, by a common uniform spacing. The inner edge of the diamond-shaped aperture 54, as will be described, provides a sharp insulation-cutting surface that will remove or displace insulation 28 from wires 24 without the need for stripping of those wires 24.

Referring also to FIG. 6, each of the elongated metal strips 52 is folded midway along its length along fold lines 60 separated by substantially the width of the printed circuit board substrate 12 and roughly centered halfway along the metal strip and erected perpendicularly to a longest extent of the metal strips 52. In this way the diamond-shaped aperture 54 folds on itself to become a slot 62 widest near the fold lines 60 that will fit over the edges 14 and tapering to a width substantially equal to the diameter of the wire conductor 30 as one moves away from the fold lines 60. The metal strips may be a conducting material such as copper, aluminum, brass, bronze or the like.

The folded metal strip 52 may then fit over the edge 14' of the printed circuit board 10 so that fold lines 60 are parallel and overlie the corners between the edges and the upper and lower surface of the printed circuit board 10; in this position, the slots 62 align with a corresponding slightly larger slot 64 cut into the edge 14' of the printed circuit board 10 in the manner of slots 22 albeit without the requirement of the hole 20. A conductive pad 66 may be placed near the innermost edge of the slots 64 communicating with other traces 16.

Referring now to FIGS. 7 and 8, the folded metal strip 52 as placed over the edge 14' of the printed circuit board 10 may receive a wire 24 in the manner of an insulation displacement connector with the tapered walls of the slot 62 cutting into and displacing the outer insulation 28 of the wire 24 so that the tapered walls of the slot 62 contact and electrically connect to the inner conductor 30 of the wire 24 to form a gas-tight seal. The bends at fold lines 60 may be slightly greater than 90 degrees so that the folded metal strip 52 as placed over the edge 14' grips the upper and lower surfaces of the printed circuit board 10 to retain it in position.

The strip 52 in turn may be electrically connected to the pad 66 by a solder fillet 70 (or by solder between the pad 66 and strip 52 applied by reflow soldering) to complete the connection between the conductor 30 and the pad 66 and ultimately to the traces 16. The solder fillet 70 also serves to retain the strip 52 on the edge 14'.

Referring to FIGS. 5 and 6, the lead frame 56 may be retained in attachment to the folded strips 52 until installation of the folded strips 52 is complete on the printed circuit board 10 and then removed by breaking of the tabs 58. The construction of insulating displacement terminals in general, including materials and design, is described in U.S. Pat. No. 7,347,717 issued Mar. 25, 2008, and hereby incorporated by reference.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there may be one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention. All of the publications described herein, including patents and non-patent publications, are hereby incorporated herein by reference in their entireties.

What we claim is:

1. A printed circuit board assembly comprising:
   a printed circuit board having an insulating, substantially planar and rigid substrate defining opposed laterally extending faces bounded at a periphery by edges, at least one face including adhered, laterally-extending conductive traces; and
   electrical components attached to the conductive traces to provide at least a portion of an electrical circuit;
   wherein at least one edge of the printed circuit board substrate provides a set of notches, each given notch of the set of notches extending laterally from the at least one edge to a respective termination point within the periphery and having opposed notch walls;
   wherein each termination point is partially surrounded by electrically conductive material covering a surface of at least one face outside of each given notch about the termination point, the electrically conductive material electrically connected with at least one conductive trace of the conductive traces electrically communicating with at least one of the electrical components;
   whereby a given electrical wire conductor may be attached to at least one trace of the conductive traces by orienting the given electrical wire conductor to extend perpendicularly to the faces and sliding the given electrical wire conductor laterally into the given notch to electrically connect with corresponding electrically conductive material;
   wherein the notches are tapered to have an opening width measured perpendicularly to an extent of the notch between the at least one edge and the termination point greater than a width at the termination point measured perpendicularly to an extent of the notch; and
   wherein the termination point is a C-shaped hole providing a constricting portion narrower than the opening width and narrower than a diameter of the C-shaped hole, the constricting portion being positioned between the opening width and the termination point;
   further including multiple insulated flexible electrical wire conductors having multiple center strands surrounded coaxially by electrical insulation, the center strands of each electrical wire conductor pressed into a corresponding one of the notches and soldered to the electrically conductive material wherein the constricting portion is sized to allow the center strands to pass laterally by the constricting portion into the C-shaped hole to be retained in the C-shaped hole with the center strands compressed together.

2. The printed circuit board assembly of claim 1 wherein the electrically conductive material is trace material physically continuous with at least one trace of the conductive traces and positioned to be attached to an electrical wire conductor by soldering thereto.

3. The printed circuit board assembly of claim 1 wherein the trace material surrounds a region of each notch of the set of notches past the constricting portion at the termination point by a least 270 degrees measured from a center of the region.

4. A printed circuit board assembly comprising:
   a printed circuit board having an insulating, substantially planar and rigid substrate defining opposed laterally extending faces bounded at a periphery by edges, at least one face including adhered, laterally-extending conductive traces; and
   electrical components attached to the conductive traces to provide at least a portion of an electrical circuit;
   wherein at least one edge of the printed circuit board substrate provides a set of notches, each given notch of the set of notches extending laterally from the at least one edge to a respective termination point within the periphery;
   wherein each termination point is partially surrounded by electrically conductive material covering a surface of at least one face outside of each given notch about the termination point, the electrically conductive material electrically connected with at least one conductive trace of the conductive traces electrically communicating with at least one of the electrical components;
   whereby a given electrical wire conductor may be attached to at least one trace of the conductive traces by orienting the given electrical wire conductor to extend perpendicularly to the faces and sliding the given electrical wire conductor laterally into the given notch to electrically connect with corresponding electrically conductive material;

wherein the electrically conductive material associated with each given notch of the set of notches is a first metal plate fitting over a given notch and having a cutting edge displaced inward from edges of the given notch and tapering inward toward the termination point of the given notch to cut through insulation of an electrical wire conductor extending perpendicular to the faces when the electrical wire conductor is pressed into the given notch laterally to the termination point to provide a gas-tight electrical connection between the first metal plate and a center conductor of the electrical wire conductor.

5. The printed circuit board assembly of claim 4 wherein a portion of the first metal plate extends over at least one trace and is soldered thereto.

6. The printed circuit board of claim 4 further including a second metal plate forming a clip with the first metal plate, the second metal plate in opposition to the first metal plate fitting under the given notch and having a tapered cutting edge displaced inward from lateral edges of the given notch also to cut through insulation of an electrical wire conductor extending perpendicularly to the faces when the electrical wire conductor is pressed into the given notch laterally.

7. The printed circuit board assembly of claim 6 wherein the clip provides a front joining member holding the first and second metal plates in opposition with inward spring biasing of the first and second metal plates together to a dimension less than a thickness of the substrate between the opposed laterally extending faces.

8. The printed circuit board assembly of claim 4 further including multiple insulated flexible electrical wire conductors having center strands surrounded coaxially by electrical insulation, wherein the cutting edge has a separation greater than a diameter of the electrical insulation at the at least one edge of the printed circuit board tapering inward to a separation no greater than a diameter of the center strands at the termination point.

9. The printed circuit board assembly of claim 1 wherein the notches are spaced apart in substantially equal separation along the at least one edge.

10. The printed circuit board assembly of claim 1 wherein the conductive traces are copper cladding adhered to the printed circuit board substrate and selectively etched to define trace dimensions.

11. The printed circuit board assembly of claim 1 wherein the electrical components are selected from the group consisting of electrical switches, solid-state electrical devices, resistors, and capacitors.

12. A method of fabricating a printed circuit board assembly of a type having:
electrical components;
a printed circuit board having an insulating substantially planar and rigid substrate defining opposed laterally extending faces bounded by edges, at least one face including adhered conductive cladding providing laterally extending metallic traces, at least one edge of the printed circuit board substrate providing a set of notches, each notch extending into the at least one edge to a respective termination point and wherein each termination point is surrounded by electrically conductive material covering an uninterrupted surface of the at least one face about the termination point, the electrically conductive material electrically continuous with at least one metallic trace electrically communicating with at least one of the electrical components, wherein the notches are tapered to have an opening width measured perpendicularly to an extent of the notch between the at least one edge and the termination point greater than a width at the termination point measured perpendicularly to an extent of the notch; and wherein the termination point is a C-shaped hole providing a constricting portion narrower than the opening width and narrower than a diameter of the C-shaped hole, the constricting portion being positioned between the opening width and the termination point;

the method comprising the steps of:
(a) orienting a set of flexible electrical wire conductors, each having multiple center strands surrounded coaxially by electrical insulation, to extend perpendicularly to the faces in alignment with each notch; and
(b) sliding the flexible electrical wire conductors laterally into respective notches of the set of notches past the constricting portion to be surrounded by the electrically conductive material and in electrical communication therewith so that the center strands of each electrical wire conductor are compressed together by the C-shaped hole.

13. The method of claim 12 further including the step of positioning the electrical wire conductors in a jig to hold them parallel at a spacing corresponding to a spacing of the notches and wherein step (b) moves the jig to simultaneously engage each of the electrical wire conductors within corresponding different ones of the notches.

14. The method of claim 13 further including the step of soldering electrical wire conductors to electrically conductive material of each notch.

15. The method of claim 12 further including the step of forming a set of metal clips joined to a carrier strip, each metal clip providing a first metal plate fitting over a corresponding notch of the set of notches and having a cutting edge displaced inward from laterally opposed edges of the corresponding notch and tapering inward toward the termination point to cut through insulation of a corresponding electrical wire conductor of the set of electrical wire conductors extending perpendicular to the faces when one of the electrical wire conductors is pressed into the corresponding notch laterally to the termination point, and a second metal plate in opposition to the first metal plate fitting under the corresponding notch and having a tapered cutting edge displaced inward from the lateral opposed edges of the corresponding notch also to cut through insulation of the corresponding electrical wire conductor extending perpendicularly to the faces when the electrical wire conductor is pressed into the corresponding notch laterally;
installing the metal clips on the notches simultaneously by movement of the carrier strip; and
removal of the carrier strip.

16. The method of claim 15 wherein the metal clips and carrier strip are punched from a single sheet of material.

* * * * *